United States Patent [19]

Hartman et al.

[11] Patent Number: 4,824,511

[45] Date of Patent: Apr. 25, 1989

[54] MULTILAYER CIRCUIT BOARD WITH FLUOROPOLYMER INTERLAYERS

[75] Inventors: Frederick N. Hartman, Wilmington, Del.; Alan C. Knight, Parkersburg, W. Va.

[73] Assignee: E. I. Du Pont de Nemours and Company, Wilmington, Del.

[21] Appl. No.: 109,586

[22] Filed: Oct. 19, 1987

[51] Int. Cl.$^4$ .................................................. C09J 5/10
[52] U.S. Cl. .................... 156/306.6; 156/312; 156/333; 156/901; 428/901; 428/209; 428/421; 428/422
[58] Field of Search ............... 174/68.5; 428/209, 421, 428/422, 901; 156/306.6, 312, 333, 901

[56] References Cited

U.S. PATENT DOCUMENTS

| | | | |
|---|---|---|---|
| 2,364,993 | 12/1942 | Meyer | 143/6 |
| 2,685,707 | 8/1954 | Llewellyn et al. | 525/55 |
| 2,706,697 | 4/1955 | Enler | 430/314 |
| 2,731,068 | 1/1956 | Richards | 154/2.6 |
| 2,932,599 | 4/1960 | Dahlgren | 154/129 |
| 2,955,974 | 10/1960 | Allen et al. | 154/128 |
| 3,215,574 | 11/1965 | Koch | 156/3 |
| 3,740,678 | 6/1973 | Hill | 333/84 M |
| 4,000,348 | 12/1976 | Harlow | 428/422 |
| 4,464,704 | 8/1984 | Huie et al. | 361/414 |
| 4,512,818 | 4/1985 | Valayil et al. | 148/6.14 R |
| 4,525,693 | 6/1985 | Suzuki et al. | 333/236 |
| 4,634,631 | 1/1987 | Gazit et al. | 428/421 |
| 4,647,508 | 3/1987 | Gazit et al. | 428/421 |

OTHER PUBLICATIONS

Abstract of Japanese Publication 60-257,593, write-up by A. L. Knight, dated Jan. 27, 1986.
Japanese Publication-Patent Appln. 60-257593, dated 12-19-85, titled Multilayer Printed Circuit Board.
Abstracts of Japanese Applications: J60257,593; J60257,594; J60257,595; J60257,596; J60257,597; J60257,592; J60258,232.

Primary Examiner—Ellis P. Robinson
Assistant Examiner—P. J. Ryan

[57] ABSTRACT

A multilayer circuit board consisting of multiple circuit layers supported on sheets of PTFE or PTFE containing a fibrous stiffening agent, said circuit-bearing sheets being joined in fixed relative positions by means of separating layers of a adhesive unsintered tetrafluoroethylene resin.

1 Claim, 1 Drawing Sheet

MULTILAYER CIRCUIT BOARD WITH FLUOROPOLYMER INTERLAYERS

FIELD OF THE INVENTION

This invention relates to multilayer printed electrical circuits. More specifically, it relates to a series of circuit-bearing sheets which are bound by an adhesive made of a semicrystalline fluoropolymer resin, and to a novel process for making the bound sheets.

BACKGROUND OF THE INVENTION

Circuit boards are used to provide supported electrical connections for various components which are combined to form a system. Modern circuit boards have evolved from simple structures, such as described in U.S. Pat. No. 2,706,697 to Eisler, in which flat conducting lines are formed on one side of a sheet of insulating support material. As systems became more complex and increasing numbers of connecting lines became necessary, circuits were formed on both sides of insulating support sheets and then such circuit-bearing sheets were combined in layers with bonding or adhesive interlayers between them to form multilayer constructions of great complexity. Such multilayer boards and methods of construction are described in Chapters 20, 21, 22, and 23 of "Printed Circuits Handbook" edited by Clyde F. Coombs, and published by McGraw-Hill (second edition, 1979).

The circuit-bearing support sheet members used in making circuit boards have generally been made of thermosetting epoxy-glass or polyimide-glass, but these materials are high dielectric constant materials. While they are satisfactory for many applications, for applications in which high frequencies are used, or in which signals with very rapid rise times must be transmitted, performance would be improved by the use of insulating materials with lower dielectric constants. Reduction in dielectric constant has been achieved by using materials of lower dielectric constant. The epoxy-glass or polyimide-glass support sheets carrying printed circuits have been replaced with lower dielectric constant polytetrafluoroethylene-glass (PTFE-glass) in Japanese Kokai No. 60-257593.

To bind two or more copper-bearing support members, a variety of adhesives has been used. Such PTFE-glass circuit-bearing layers have been combined using lower melting thermoplastic layers as adhesives. Japanese Kokai No. 60-257593 uses and combines PTFE-glass circuit-bearing layers by introducing alternating layers of a perfluorinated melt-processible resin as an adhesive. Heat is applied to soften the thermoplastic portion, and pressure is used to exclude air and force the thermoplastic to conform to the circuitry. This method, however, causes movement of the circuits from their initial positions and consequent loss of essential spatial registration between circuit layers. Such movement of circuits is mentioned, for example, in U.S. Pat. No. 3,215,574 to Korb. To reduce such movement, which will sometimes herein be referred to as "lack of registration" of circuit bearing members, the Japanese Kokai apparently uses a glass cloth inserted into the adhesive perfluorinated melt-processible resin layer to reduce "swimming" or movement of the parts due to the plastic (molten) condition of the resin while under heat and pressure. Unfortunately, use of the glass cloth raises the dielectric constant of the adhesive layer. It would be beneficial to discover a construction and a method for preparing the multi-circuit board construction while maintaining registration of the circuit board members but yet which dispenses with the need for the glass cloth in the adhesive layer.

Furthermore, applicant conjectures that while heat and pressure are applied to bond the members of the multi-circuit board construction, the PTFE-glass support for the copper circuits stretches and deforms to some extent which would contribute to the ensuing lack of registration of circuits in the resulting board. It would be beneficial to discover a construction and a method for preparing it in which such stretching and deforming of the support does not occur.

SUMMARY OF THE INVENTION

It has now been found that it is possible to combine circuit-bearing support sheets using tetrafluoroethylene polymer adhesive layers, which do not contain a glass cloth, without movement of the circuits, by a two step process. In the first step the tetrafluoroethylene adhesive resin is inserted as an interlayer between the circuit-bearing layers. The tetrafluoroethylene adhesive resin is an unsintered polytetrafluoroethylene resin which has been made by polymerizing TFE to form a dispersion of solid particles in a liquid phase, and is applied in tape or dispersion form. The circuit-bearing layer comprises a PTFE or PTFE/fiber support, i.e., a polytetrafluoroethylene containing a fibrous stiffening agent, which has copper circuit elements patterned on its surface.

To complete the first process step, pressure of between about 50–1000 psi (345–6900 kPa) is applied to the assembly of circuit-bearing layers alternating with dry adhesive tetrafluoroethylene polymer interlayers. The pressure is applied at a temperature below the crystalline melting point (fusion point) of the tetrafluoroethylene polymer in the adhesive interlayer. For PTFE homopolymer, the preferred temperature in this step is between 25° C. to 250° C., but it is possible to operate anywhere from −100° C. to 320° C. For TFE copolymers used as the adhesive layer, the temperature range is −100° C. to 200° C. The pressure is applied in such a way as to cause the adhesive layers to be compacted against the circuit-bearing layers, to fill any spaces between the circuit-bearing layers, to encapsulate raised circuit elements, and to provide an insulating layer between circuit elements on adjacent layers.

In the second process step, pressure is reduced and the assembly is heated above the crystalline melting point of the tetrafluoroethylene interlayer resin and held at such elevated temperature until the interlayer particles have fused together. A suitable temperature range will be from the crystalline melting point of the resin to 400° C., (preferably 340°–380° C. for PTFE homopolymer). This second step can be carried out in a heated press at relatively low pressure, e.g., 0 to 50 psi) (0–345 kPa) or even in an oven with only the weight of associated caul plates providing any pressure. When cooled, a strongly adhering composite is obtained which is the multilayer circuit structure of this invention. Electrical connections between circuits on different layers can then be made, if desired, by known methods.

DETAILED DESCRIPTION OF THE INVENTION

The starting point for assembling the multilayer construction of this invention is a set of circuit-bearing layers supported on sheets so constructed that, when assembled, the circuit layers conform to each other with sufficient clearance to allow an adhesive interlayer to be added between them. The sheets that form the circuit layers may be spherical or ellipsoidal, or irregular shaped. For most purposes the shape of choice will be planar as shown in FIG. 1, where the PTFE or PTFE-glass support sheets are labelled B and the conducting circuit members (usually copper) are labelled A.

Figure 1:
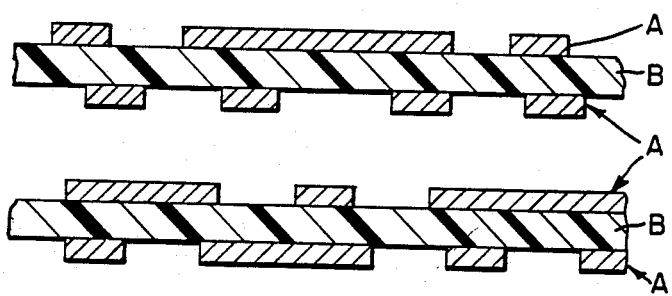

FIG. 1 shows two planar layers in which support sheet members, B, are used to support circuit layers, A, which consist of flat lines of an electrically conducting material, generally copper, arranged in the desired circuit pattern. The conducting material should be well adhered to the support members for best performance. It is desirable to have a peel strength between the conducting material and the support sheet of 3 pounds per linear inch (3.5 kgm per linear cm) or better. There may be any desired number of such circuit-bearing layers. The circuits may be on both sides of the support as shown, or on only one side of one or more layers.

The support member is a PTFE sheet or a composite of polytetrafluoroethylene (PTFE) and a fibrous material such as glass fiber.

If the circuit pattern is formed from copper, treatment is sometimes useful in order to obtain good adhesion between the copper and the support. Suitable treatments include red and black oxidizing treatments, see for example Allen et al., U.S. Pat. No. 2,955,974, and Valayil et al., U.S. Pat. No. 4,512,818. Alternatively the copper may be plated with brass, cadmium, nickel, tin, or zinc with resultant improved adhesion. Oxide treatments, especially the black oxide treatments, leave a surface which is mechanically fragile and easily damaged by contact during subsequent handling. When such a treatment is used on circuits to be assembled by the process of this invention, it may be advantageous to further treat the surface by coating it with a dispersion of poly(tetrafluoroethylene), drying to remove water, and heating above the crystalline melting point to fuse the coating. Coating in this way with PTFE, or other suitable resin, protects the oxide surface from mechanical damage and does not interfere with the subsequent steps in the assembly process. When such a coating is used, better adhesion is obtained if the piece with the black oxide coating is heated, before coating with PTFE, to the temperature to be used in fusing the PTFE coating.

The circuits, A, may be formed on the support, B, by any desired process to obtain the circuit-bearing layer. Examples include sputtering of a metal through the openings in a mask, or silk screening a conductive composition onto the surface. The preferred method is, however, to start with a support already copper-clad and form the circuits by means of a photoresist and etching technique such as is described in chapters 6, 7, and 8 of "Printed circuits Handbook", ibid.

Figure 2:
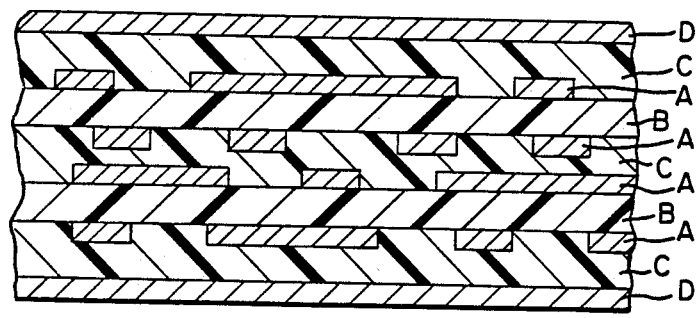

The first assembly step is to insert a layer of the tetrafluoroethylene polymer adhesive between each pair of layers of the circuit-bearing members. The tetrafluoroethylene polymer adhesive layer is marked C in FIG. 2. The adhesive encapsulates the circuit-bearing layers, electrically separates the circuits on adjacent circuit-bearing members, and serves to bind together the circuit-bearing members. Layers marked A and B in FIG. 2 are the same as in FIG. 1. Layers marked D are cap planes, which may be of copper.

The tetrafluoroethylene polymer used as the adhesive can be an unsintered dispersion produced polytetrafluoroethylene or can be an unmelted, melt-processible, semicrystalline, tetrafluoroethylene copolymer. Thus the adhesive tetrafluoroethylene polymer can be a homopolymer of tetrafluoroethylene, a copolymer of tetrafluoroethylene with at least one other perfluorinated olefin of 3–6 carbons, a copolymer of tetrafluoroethylene with at least one perfluorinated vinyl ether of 3–7 carbons, a copolymer of tetrafluoroethylene with a minor quantity of at least one non-perfluorinated vinyl monomer of 3–8 carbons, or a copolymer of tetrafluoroethylene with a minor quantity of more than one of the above-mentioned comonomers. Since low dielectric constant is an important aspect of the circuit boards of this invention, perfluorinated comonomers are preferred.

The tetrafluoroethylene polymers are obtained by polymerizing TFE in a dispersion form. Dispersion polymerization techniques which provide suitable fluoropolymer resins are, for example, described by Renfrew, U.S. Pat. Nos. 2,534,058, by Berry, 2,662,065, by Cardinal et al., 3,142,665, and by Kuhls, 4,391,940.

The TFE adhesive polymer, whether PTFE or melt-processible TFE copolymer, must be unsintered. This means that the polymer should not previously have been heated hot enough for any melting to occur, or for the original dispersion particles to soften and fuse together. The adhesive may be maintained as a stable dispersion and applied as a coating. It may have been coagulated and dried to form a particulate solid, and the solid mixed with lubricant and shaped to form an object such as a sheet. If a lubricant is used, all the lubricant should be removed from the object before use.

One way to insert the layers of tetrafluoroethylene adhesive, especially unsintered PTFE, is to use paste extruded tape. The process of mixing dried dispersion polymer with lubricant and forming it into shapes by paste extrusion has been described in Llewellyn and Lontz, U.S. Pat. No. 2,685,707. Flat sheet, made by this process, called paste extruded tape or sheet, and dried but not sintered, may be laid between circuit-bearing layers for the assembly step. The lubricant used in forming the sheet, or tape, must be completely removed, however, or poor adhesion will be obtained between the unsintered PTFE and the copper bearing layer. Lubricant removal generally involves a heating step to temperatures on the order of 275° C. The temperature during lubricant removal must be kept low enough to avoid any melting of the polymer crystallites, or any fusion of particles. Rolling or calendering of the tape after paste extrusion can be accepted, but any drawing or handling which applies tension to the tape should be avoided because it tends to generate voids in the resin.

Another way to form the tetrafluoroethylene polymer adhesive on the circuit-bearing layer is to spray the circuit-bearing layer directly with an aqueous dispersion of the adhesive. Several sprayed coatings may be required, each followed by drying at temperatures below the crystalline melting point of the adhesive polymer to remove the dispersion liquid and other volatile components. Temperatures as high as 275° C. for periods as long as 22 hours have been used to remove volatiles without adverse effects. For the spraying step a sprayer should be used in which the liquid is aspirated into the spray nozzle rather than one in which liquid is forced into the spray nozzle by pressure. The aspirating sprayer produces lower velocity gradients in the liquid.

High velocity gradients, or shear rates, tend to cause coagulation of dispersions.

Surface-active agents are frequently added to tetrafluoroethylene polymer dispersions to prevent coagulation during shipment and to improve their characteristics for application as coatings. In spraying dispersion to form a coating, it is possible to use dispersion directly from polymerization, but it is more desirable to add a surface-active agent, or wetting agent, so that the sprayed dispersion better wets the surface of the layer to be sprayed. A good surface-active agent will also reduce any tendency for the dispersion to clog the spraying apparatus. But the wetting agent must be completely removed or it will reduce adhesion to the circuit layer. One way to assure removal of the wetting agent is to use a volatile, water-soluble liquid such as methanol, acetone, or ethylene glycol in sufficient concentration in the dispersion to give the desired wetting action.

Surface-active agents of higher molecular weight are more desirable because of their anti-clogging activity. Removal is more difficult, however, because of lower volatility. One type of surface-active agent which is sufficiently volatile to be rapidy removed by heating is an ammonium salt of a perfluorinated aliphatic carboxylic acid with 8 or 9 carbon atoms. These compounds stabilize fluoropolymer dispersions and sublime in the range between 125° and 200° C.

A less volatile dispersing agent can be used if it is readily oxidized by atmospheric oxygen, below the sintering temperature of the resin, to form volatile products. Another way to proceed is to use a non-volatile organic dispersing agent, then, after the coating and drying steps, to spray with a solution of a volatile oxidizing agent such as hydrogen peroxide, or ammonium nitrate, and heat at temperatures below the sintering point of the resin to destroy the dispersing agent.

Other methods of applying the tetrafluoroehylene adhesive are doctoring, painting, dipping, or curtain-coating dispersion onto the circuit-bearing layers. Methods starting with dried resin include calendering of powder, and calendering or doctoring lubricated paste onto the circuit-bearing layers.

It is essential that unsintered PTFE resin be used next to the circuit layers to fill the spaces among the circuits. For example, a composite adhesive structure using a sintered sheet of PTFE between unsintered PTFE adhesive layers will have particular advantages where dielectric thicknesses greater than 0.003 inches (0.08 mm) are required.

After assembling the circuit-bearing layers with the adhesive layers between them, the next process step is to apply pressure to the assembly. Pressure can be applied in a laminating press, or by a vacuum-bag and pressure-vessel technique, but it must be done at a temperature below the crystalline melting point of the tetrafluoroethylene polymer adhesive, and furthermore at a temperature low enough so that the metal circuit, A of FIG. 1, retains good adhesion to the substrate, B of FIG. 1. Good results have been obtained at room temperature. The pressure must be sufficient to cause the adhesive to conform to the surface of, and encapsulate the circuit bearing layer. Generally the pressure is between about 50–1000 psi (345–6900 kPa). The necessary pressure cannot be defined for every condition; but at room temperature, pressures as low as 200 psi (1380 kPa) have been sufficient for certain circuit patterns on planar sheets. Lower pressures could be used at high temperatures.

The next step is to heat the assembly above the crystalline melting point of the tetrafluoroethylene adhesive polymer in the absence of substattial pressure. Heating can be up to about 400° C. The preferred conditions are heating to about 360° C. for 5 to 15 minutes. Surprisingly, no pressure is required in this heating step. Heating can be carried out in a press with no applied pressure or in an oven. Most polymeric materials would show partial or complete recovery when heated after deformation at low temperature. The tetrafluoroethylene adhesive resins defined as useful in this invention do not show this plastic memory effect under the conditions of this invention. It is this lack of a recovery tendency that creates the successful effect in this invention. If there were a recovery tendency and no applied pressure were used, any plastic memory effects would shift the circuits out of registration, and it is maintenance of registration between layers that is one of the important benefits of this invention. If significant pressure is used at high temperatures, the resulting stresses shift the circuits out of registration. In the practice of the invention it may be desirable to maintain some low pressure to prevent warping of the assembly during the sintering and subsequent cooling steps, but care must be taken to keep the pressure low enough to avoid shifting the circuits.

After sintering, the assembly is cooled to room temperature. An example of the resulting final structure is shown in FIG. 2. FIG. 2 shows the circuit-bearing layers of FIG. 1 assembled with cap layers D and adhesive layers C. The circuitry is thoroughly encapsulated with no voids in the resin material, and with maintenance of the spatial positions of the circuits, and with good adhesion between the circuit-bearing layers and the adhesive layers.

EXAMPLE 1

This example describes the construction of a multilayer circuit board in which unsintered dispersion-produced PTFE tape is placed between circuit-bearing layers, pressure is applied at low temperature, then the assembly is heated without pressure to sinter the unsintered PTFE.

An aqueous dispersion of solid particles of poly(tetrafluoroethylene) with particle size about 0.2 micrometers similar to that described in U.S. Pat. No. 2,534,058 to Renfrew was coagulated by stirring vigorously. The solid was separated and dried. 100 parts of dry solid was mixed with 23.8 parts of a colorless hydrocarbon oil sold by Humble Oil Co. under the trademark of "Varsol" grade 1. After standing for 2 hours at 30° C., the mixture was placed in a cylinder with a tight-fitting piston and forced through a circular orifice to form beading. Taking care to avoid loss of lubricant by evaporation, the beading was passed three times between calender rolls, each time reducing the spacing between rolls, thus converting it to a sheet or tape with a thickness of about 0.010 inches (0.25 mm).

The lubricant was thoroughly removed from the tape by the following procedure. The tape was immersed in acetone, and allowed to stand for 10 min. This was repeated using fresh acetone. After draining and standing at room temperature to allow most of the remaining acetone to evaporate, the tape was dried in a circulating air oven at 150° C. for 24 hours, then at 200° C. for 16 hours. The resulting product is an example of the tape referred to herein. Similar products can be obtained by variations of the above process, some of which are described in U.S. Pat. No. 2,685,707 to Llewellyn and Lontz.

A commercially available circuit-bearing layer, "Di-Clad" type 522, made by the Keene Division of the Howe Corp., was used in the next step. This circuit-bearing layer was a sheet 0.013 inches (0.33 mm) thick of poly(tetrafluoroethylene) (PTFE) stiffened with a woven glass fabric and tightly bonded on both sides to copper foil about 0.0014 inches (36 micrometers) thick. The proportion of glass to PTFE was such as to give a dielectric constant of 2.50.

Simulated circuit patterns were formed on one side of the laminate by placing pressure-sensitive tape where copper was desired, then etching away the copper foil that remained exposed. Etching of copper was carried out by immersing the taped laminate in a solution made by combining 300 parts water, 25 parts concentrated hydrochloric acid, and 175 parts of technical grade ferric chloride. A stream of air was bubbled into the bath during etching to provide agitation and convert ferrous ions formed by reaction with copper back to the ferric state.

The circuit patterns were treated to produce a black copper oxide coating on the exposed surfaces. This was done using proprietary solutions supplied by the Enthone Co. and following their recommended procedure. A similar treatment using a basic solution of sodium chlorite is described in U.S. Pat. No. 2,364,993 to Meyer. The use of black oxide treatments to improve adhesion of copper to resins is well known.

Two such pieces, each 6"×8" (152×203 mm) were prepared with simulated circuit patterns covering a 4×4 inch (102×102 mm) region on one side, and with a 4×4 inch square of copper removed from the other side, centered in the piece of laminate and opposite the circuit patterns. Pieces of the unsintered poly(tetrafluoroethylene) tape described above were laid on the patterned side of one circuit-bearing layer. The full 6"×8" area was covered with the tape. The other circuit-bearing layer was then laid, patterned side down, on top of the tape layer. The assembly was placed in a press between two pieces of light weight aluminum foil and with a sheet of rubber above the top piece of aluminum foil to distribute the pressure.

With the press at room temperature, a force of 40,000 lb. (178 kN) was applied, giving a pressure on the area of the assembly of 833 psi (5740 kPa). The press was then opened, the rubber sheet removed, and the assembly moved to another press at 360° C. This press was closed without enough force to show on the gage so as to contact the assembly without applying pressure. This condition will be described as contact pressure only. The assembly was held in the hot press for 15 minutes, then moved back to the cold press to cool with contact pressure only.

The resultant assembly was well-adhered. In the 4"×4" opening, the substrate material was sufficiently translucent so that the two superimposed circuit patterns could be seen when held to the light. The high and uniform translucency showed that there was complete contact between the layers and suggested adhesion thoughout. There was no obvious distortion, or movement of circuits, visible in this type of inspection. Small pieces were cut from the circuit area and mounted in epoxy resin so that cross-sections of the board could be polished and examined. It was found that the region between circuit layers was filled, and the circuits encapsulated, by resin derived from the unsintered tape. There was good and uniform separation of the circuits by the insulation layer.

EXAMPLE 2

This example shows that circuits are well-encapsulated by a process for making multilayer circuit boards in which circuit-bearing layers are coated with PTFE in dispersion form, the coating sintered, unsintered PTFE tape placed between the circuit-bearing layers, pressure applied at low temperature, then heat applied without pressure to sinter the PTFE tape.

Circuit-bearing layers were prepared like the ones described in Example 1. After the black-oxide treatment, however, a layer of sintered PTFE was applied to protect the black-oxide coating. This was done as follows. Circuit-bearing layers were dried in a circulating air oven at 100° C. for at least 30 min., then heated for 10 min. in an oven set at 385° C. When cool, they were immersed in a commercial aqueous dispersion of unsintered PTFE sold by Du Pont under the trademark "Teflon" 30 fluorocarbon resin. This sample of dispersion contained 60% solids. The layers were withdrawn mechanically at a controlled rate to produce a uniform coating. The layers were allowed to dry at ambient conditions. They were then placed in an oven at 100° C. for at least 30 min., then heated for 10 min. in an oven set at 385° C. This gave a thin transparent coat of sintered PTFE over the circuit-bearing layers.

Two circuit-bearing layers were combined to form a completed multilayer structure by using unsintered tape, cold-pressing, and carrying out a separate sintering step as in Example 1. Examination of cross-sections, as in Example 1, showed that the space between layers was filled and that the circuits were encapsulated and well-separated by resin.

EXAMPLE 3

This example shows that there is good adhesion of the PTFE to circuit-bearing layers when layers are put together with unsintered tape by the process of Example 2.

Three test multilayers were made as in Example 2, except that no copper was etched from the side of the base laminate opposite the circuit patterns and the unsintered tape covered only the 4"×4" region of the circuit patterns. The three multilayer assemblies differed also in the pressure used, as will be shown in the table below.

The assemblies were tested for adhesion by peeling them apart so that the peeling force was put onto the new resin layer between the two circuit layers. Strips 0.50 in. (12.7 mm) wide were cut the long way of the 6"×8" assembly. Since only the central 4 inches had resin between the laminates, there was a two inch region of laminate at either end that could be gripped by the testing machine. These were pulled apart with no additional support so that, while there was always 180° between the two stressed portions, the rest of the specimen could assume any angle with respect to the test direction. The traces were irregular with rapid fluctuations. Average values of peel stress are reported based on the envelope of the minimum force values for 5 strips.

Examination of the specimens after peel showed that separation sometimes occurred between the resin of the adhesive layer and the original circuit-bearing surface, and sometimes by separation of layers of glass fabric within the support. Thus, the adhesive strength of the new bond was of the same order of magnitude as the cohesive strength of the base laminate. Results demonstrate a substantial adhesive force provided by the resin layer.

| Multilayer No. | Force Used in Assembly lb. | Pressure During Assembly psi | Lower Envelope Peel Strength lb/linear inch |
| --- | --- | --- | --- |
| 1 | 40,000 | 2,500 | 18 |
| 2 | 20,000 | 1,250 | 20 |
| 3 | 10,000 | 625 | 26 |

EXAMPLE 4

This example demonstrates the construction of a multilayer circuit board by a process in which the circuit layers are coated with unsintered PTFE made from dispersion polymerization. Unsintered PTFE dispersion-produced tape is placed between the circuit layers, pressure is applied at low temperature, then heat is applied at low pressure to sinter the PTFE.

A polytetrafluoroethylene resin dispersion was prepared from the dispersion polymerization of PTFE (solids content was about 42.8%). To 1005 parts of the dispersion was added 214 parts of water and 214 parts of methanol. This was filtered through cheesecloth to remove coagulum formed. Solids content of the final dispersion was 27.4%.

Two circuit-bearing layers, or planar shells, were prepared as in Example 1 except that the copper was left entire on the sides opposite the circuits rather than removing a 4"×4" window. The sides bearing the circuits were sprayed with the dispersion prepared above to coat the surfaces with 0.0264 g/sq.in (40.92 g/sq.m) of unsintered PTFE. Adhesive unsintered PTFE tape such as was described in Example 1, but with a weight of 0.08 g/sq.in (124 g/sq.m), was placed between the coated planar shells with the circuits toward the unsintered tape. The assembly was placed in an unheated press with a sheet of rubber to distribute the pressure and 40,000 lb (178 kN) of force was applied. This gave a pressure on the assembly of 833 psi (5.74 MPa).

The sheet of rubber was removed and the assembly transferred to a press heated to 360° C. where it was held, with contact pressure only, for 15 minutes. The assembly, including caul plates, was then transferred to a press at room temperature to cool. Examination of cross sections, as in Example 1, showed that the space between layers was filled and that the circuits were encapsulated and well-separated by adhesive resin.

EXAMPLE 5

This example shows that a melt-processible copolymer of tetrafluoroethylene and perfluoro(propyl vinyl ether) can be used for the interlayers in the process of invention.

Simulated circuit layers were produced as in Example 1, except that the laminate was a "DiClad" laminate in which 0.010 inches (0.254 mm) of PTFE-glass dielectric was bonded on both sides to 1 oz. rolled annealed copper foil about 35 micrometers thick. The proportions of glass and PTFE in the dielectric were such as to give a dielectric constant of 2.20.

The circuit bearing sides were sprayed with several coats of a dispersion of a copolymer of tetrafluoroethylene containing 3% perfluoro(propyl vinyl ether) units. This was a dispersion as polymerized, which had been diluted with methanol. To 500 parts of aqueous dispersion of 34.6% solids was added 100 parts methanol to give a dispersion with 28.8% solids.

Pieces were dried at ambient conditions between coats, then at 100° C. for 30 minutes. They were then placed together with coated sides in and put in a cold press with caul plates and a sheet of rubber. The press was closed with 833 psi (5.74 MPa) pressure. The rubber was removed and the assembly was transferred to a press at 360° C. with contact pressure only for 15 minutes, then back to a cold press, contact pressure only, to cool.

Sections showed that the circuit lines were completely encapsulated and the adhesion layers were free from voids.

EXAMPLE 6

This example shows that a sheet of sintered PTFE can be included as part of the adhesive layer with unsintered dispersion-produced resin next to the circuit layers. Good adhesion and encapsulation of circuits was achieved.

Simulated circuit layers were prepared as in Example 1 except that no copper was removed from the sides of the laminates opposite the circuits. The circuits were coated with tin by an electrolytic displacement process. The circuit-bearing sides were then sprayed with the tetrafluoroethylene resin used in Example 4, dried at ambient conditions between coats, then dried at 100° C. for 30 min. The amount of PTFE coating thus added to each piece was 0.010 g/sq.in (15.5 g/sq.m).

Two of the tetrafluoroethylene resin-coated, circuit-bearing layers were assembled, circuit sides in. A 6"×8" (152×203 mm) piece of commercial skived PTFE tape (sintered PTFE sheet) with a thickness of 0.016 inches (0.41 mm) was placed between the circuit-bearing layers. The assembly was placed, with caul plates and a piece of rubber sheet, in a press held at room temperature while 417 psi (2.87 MPa) pressure was applied.

The rubber sheet was then removed and the assembly transferred to a press at 360° C. where it was held for 15 minutes with the press closed, but no pressure on the gage. This condition is called "contact pressure only" in other examples, The assembly was then moved to a cold press to cool, again with contact pressure only.

The resulting construction had strong adhesion at the new interlayer. Circuits were well encapsulated.

We claim:

1. A process of assembling circuit-bearing sheets containing surface portions of conductive circuitry and surface portions of polytetrafluoroethylene to form multilayer laminates in which unsintered tetrafluoroethylene polymer made by dispersion polymerization is inserted between the sheets, pressure is applied at 50–1000 psi at a temperature below the fusion temperature of the polymer to encapsulate the circuits, and, in a separate step at a lower pressure of 0–50 psi the assembly is heated above the fusion temperature of the polymer to fuse the polymer particles into a continuous mass.

* * * * *